(12) United States Patent    (10) Patent No.:    US 12,660,507 B2

Hashemi et al.      (45) Date of Patent:    Jun. 16, 2026

(54) INVERTED WIDE BASE DOUBLE MAGNETIC TUNNEL JUNCTION DEVICE

(71) Applicant: International Business Machines Corporation, Armonk, NY (US)

(72) Inventors: Pouya Hashemi, Purchase, NY (US); Daniel Charles Edelstein, White Plains, NY (US); Andrew Giannetta, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 808 days.

(21) Appl. No.: 17/530,690

(22) Filed: Nov. 19, 2021

(65) Prior Publication Data

US 2023/0165155 A1    May 25, 2023

(51) Int. Cl.
| | |
|---|---|
| *H10N 50/01* | (2023.01) |
| *H10B 61/00* | (2023.01) |
| *H10N 50/80* | (2023.01) |

(52) U.S. Cl.
CPC ............. H10N 50/01 (2023.02); H10B 61/00 (2023.02); H10N 50/80 (2023.02)

(58) Field of Classification Search
CPC ......... H10N 50/01; H10N 50/80; H10B 61/00
USPC ........................................................ 257/421
See application file for complete search history.

(56) References Cited

U.S. PATENT DOCUMENTS

| | | | | | |
|---|---|---|---|---|---|
| 8,891,290 | B2 * | 11/2014 | Tang | ................... | G11C 11/1675 365/158 |
| 10,522,746 | B1 * | 12/2019 | Sundar | ................... | H10N 50/80 |

| | | | | | |
|---|---|---|---|---|---|
| 10,692,927 | B1 * | 6/2020 | Gottwald | ............... | H10N 50/85 |
| 10,707,413 | B1 * | 7/2020 | Dutta | ..................... | H10N 50/01 |
| 10,797,225 | B2 * | 10/2020 | Sundar | ................... | H10N 50/01 |
| 2002/0145902 | A1 * | 10/2002 | Kunikiyo | ........... | G11C 11/1675 365/97 |
| 2013/0119495 | A1 * | 5/2013 | Vetr | ........................ | H10B 61/22 257/E29.323 |
| 2017/0338403 | A1 * | 11/2017 | Kim | ........................ | H10N 50/80 |
| 2019/0189913 | A1 * | 6/2019 | Doyle | ................... | G11C 11/161 |
| 2019/0206472 | A1 * | 7/2019 | Bozdag | ................. | H10N 50/85 |
| 2019/0252601 | A1 * | 8/2019 | Chatterjee | ........... | G11C 11/1675 |
| 2019/0334080 | A1 * | 10/2019 | Ahmed | ................. | H10N 50/01 |
| 2021/0126190 | A1 * | 4/2021 | Couet | ................... | H10N 50/85 |
| 2021/0135090 | A1 | 5/2021 | Sun | | |
| 2021/0193912 | A1 * | 6/2021 | Gupta | ................. | G11C 11/1655 |

(Continued)

*Primary Examiner* — Jami Valentine Miller

(74) *Attorney, Agent, or Firm* — Scully, Scott, Murphy & Presser, P.C.; Yuanmin Cai

(57)       ABSTRACT

A method of manufacturing a double magnetic tunnel junction device includes forming a first magnetic tunnel junction stack, forming a spin conducting layer on the first magnetic tunnel junction stack, forming a metallic ring layer on the sides of the spin conducting layer; and forming a second magnetic tunnel junction stack on the spin conducting layer. The second magnetic tunnel junction stack has a width that is greater than the width of the first magnetic tunnel junction stack. A double magnetic tunnel junction device includes a first magnetic tunnel junction stack, a spin conducting layer on the first magnetic tunnel junction stack, a metallic ring layer on the sides of the spin conducting layer; and a second magnetic tunnel junction stack on the spin conducting layer. The second magnetic tunnel junction stack has a width that is greater than the width of the first magnetic tunnel junction stack.

8 Claims, 7 Drawing Sheets

(56) References Cited

U.S. PATENT DOCUMENTS

| | | | |
|---|---|---|---|
| 2021/0288242 A1 | 9/2021 | Yogendra et al. | |
| 2021/0288246 A1* | 9/2021 | Hashemi | H10B 61/00 |
| 2021/0296574 A1* | 9/2021 | Reznicek | H10N 50/10 |
| 2022/0199898 A1* | 6/2022 | Hashemi | H01F 10/329 |
| 2022/0416156 A1* | 12/2022 | Hashemi | H10N 50/10 |
| 2023/0039834 A1* | 2/2023 | Hashemi | H10N 50/01 |
| 2023/0165155 A1* | 5/2023 | Hashemi | H10N 50/80 |
| | | | 257/421 |
| 2023/0189659 A1* | 6/2023 | Debashis | H10N 50/10 |
| | | | 257/421 |

* cited by examiner

INVERTED WIDE BASE DOUBLE MAGNETIC TUNNEL JUNCTION DEVICE

BACKGROUND

The present disclosure relates to magnetoresistive random-access ("MRAM") memory device cells including double magnetic tunnel junction ("DMTJ") stacks and methods of manufacturing MRAM devices.

SUMMARY

Embodiments of the present disclosure relate to a method of manufacturing a double magnetic tunnel junction device. The method includes forming a first magnetic tunnel junction stack, forming a spin conducting layer on the first magnetic tunnel junction stack, forming a metallic ring layer on the sides of the spin conducting layer; and forming a second magnetic tunnel junction stack on the spin conducting layer. The second magnetic tunnel junction stack has a width that is greater than a width of the first magnetic tunnel junction stack.

Other embodiments relate to a double magnetic tunnel junction device. A double magnetic tunnel junction device includes a first magnetic tunnel junction stack, a spin conducting layer on the first magnetic tunnel junction stack, a metallic ring layer on the sides of the spin conducting layer and a second magnetic tunnel junction stack on the spin conducting layer. The second magnetic tunnel junction stack has a width that is greater than a width of the first magnetic tunnel junction stack.

Further features as well as the structure and operation of various embodiments are described in detail below with reference to the accompanying drawings. In the drawings, like reference numbers indicate identical or functionally similar elements.

DETAILED DESCRIPTION

Figure 1:
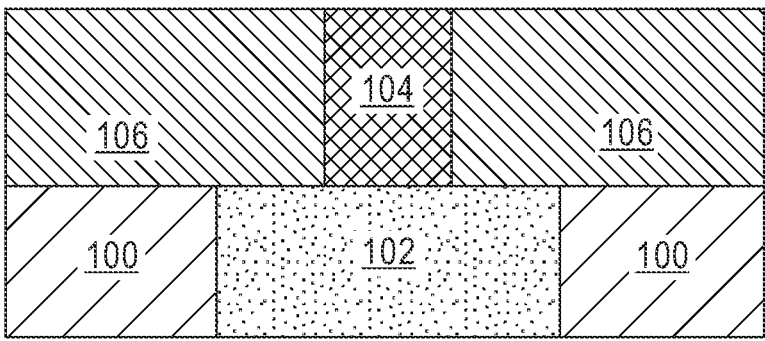
FIG. 1 is a cross-sectional view of back end of line base layers that are formed underneath a double magnetic tunnel junction (DMTJ) stack, according to embodiments.

The present disclosure describes MRAM devices including double magnetic tunnel junction ("DMTJ") stacks and methods of manufacturing MRAM devices. In particular, the present disclosure describes a single bit MRAM device with two MJTs stacked vertically with an inverted wide base (i.e., where the top MTJ stack has a larger critical dimension ("CD") than the bottom MTJ stack).

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit ("IC") fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping, and patterning/lithography.

Deposition is any process that grows, coats, or otherwise transfers a material onto the wafer. Available technologies include physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma-enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etching processes (either wet or dry), chemical-mechanical planarization ("CMP"), and the like. One example of a removal process is ion beam etching ("IBE"). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching ("RIE"). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light-sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, embedded DRAM ("eDRAM") is a dynamic random-access memory ("DRAM") integrated on the same die or multi-chip module ("MCM") of an application-specific integrated circuit ("ASIC") or microprocessor. eDRAM has been implemented in silicon-on-insulator ("SOI") technology, which refers to the use of a layered silicon-insulator-silicon substrate in place of conventional silicon substrates in semiconductor manufacturing. eDRAM technology has met with varying degrees of success, and demand for SOT technology as a server memory option has decreased in recent years.

Magnetoresistive random-access memory ("MRAM") devices using magnetic tunnel junctions ("MTJ") are one option to replace existing eDRAM technologies. MRAM is a non-volatile memory, and this benefit is a driving factor that is accelerating the development of this memory technology. Current MRAM MTJ structures are relatively slow, and the only way to reach MTJ write target speeds comparable to eDRAM (.about.5 ns) is with double magnetic tunnel junctions ("DMTJ").

In certain DMTJ devices, a wide non-magnetic base modified DMTJ device is used to increase the MTJ's switching efficiency by eliminating both the resistance area ("RA") penalty and magnetoresistance ("MR") penalty that are both associated with standard DMTJs that have top and bottom MTJs with similar critical-dimensions ("CD"). These types of wide-based devices provide double spin-current sourcing ("DSTT") benefits. Also, for these types of devices, the bottom barrier layer can have a relatively high RA. Certain of these devices leverage spin-diffusion transport in a non-magnetic ("NM") metal layer that is provided between the two MTJ stacks, and they can achieve a reduction in the charge current density through the bottom MgO layer. However, in certain of these wide base DMTJ devices, each of the MTJ stacks include a reference layer. The combination of the two separate reference layers and the intermediate NM layer results in a taller DMTJ stack, which increases the complexity of the manufacturing process and may lead to electrical shorts across the barrier.

The present embodiments include DMTJ structures and methods of fabricating DMTJ structures where one of the MTJ stacks has a wider base than the other. In certain of these embodiments, the MRAM device includes a DMTJ structure with an inverted structure (i.e., where the top MTJ stack has a larger critical dimension ("CD") than the bottom MTJ stack).

Referring now to the drawings in which like numerals represent the same or similar elements and initially to FIG. 1, an exemplary method of manufacturing a DMTJ stack to which the present embodiments may be applied is shown. Several back end of line ("BEOL") layers are formed. In general, the BEOL is the second portion of IC fabrication where the individual devices (transistors, capacitors, resistors, etc.) are interconnected with wiring on the wafer. As shown in FIG. 1, a first BEOL layer includes a BEOL metal layer 102 and a BEOL dielectric layer 100. The BEOL metal layer 102 can include, for example, Cu, TaN, Ta, Ti, TiN or a combination thereof. A BEOL dielectric layer 100 is formed on the sides of the BEOL metal layer 102. The BEOL dielectric layer 100 may be composed of, for example, SiOx, SiNx, SiBCN, low-κ., NBLOK, or any other suitable dielectric material.

Another BEOL layer is formed on the BEOL metal layer 102 and the BEOL dielectric layer 100. In particular, a via fill layer 104 is formed on the BEOL metal layer 102, and a via dielectric layer 106 is formed on the sides of the via fill layer 104. Initially, the via dielectric layer 106 may be formed by patterning via lithography. Then, a via is formed in the via dielectric layer 106 by, for example, RIE to remove a space for subsequent filling with the via fill layer 104. In certain embodiments, the via fill layer 104 may include a material such as W, Cu, TaN, Ta, Ti, TiN, TiOCN, TaOCN, or a combination of these materials. The via fill layer 104 can be formed by CVD, PVD, ALD or a combination thereof. After the via fill layer 104 is formed, the structure is subjected to, for example, CMP to planarize the surface for further processing. The structure including the BEOL layers shown in FIG. 1 is a starting structure upon which the MTJ stacks are to be formed.

Figure 2:
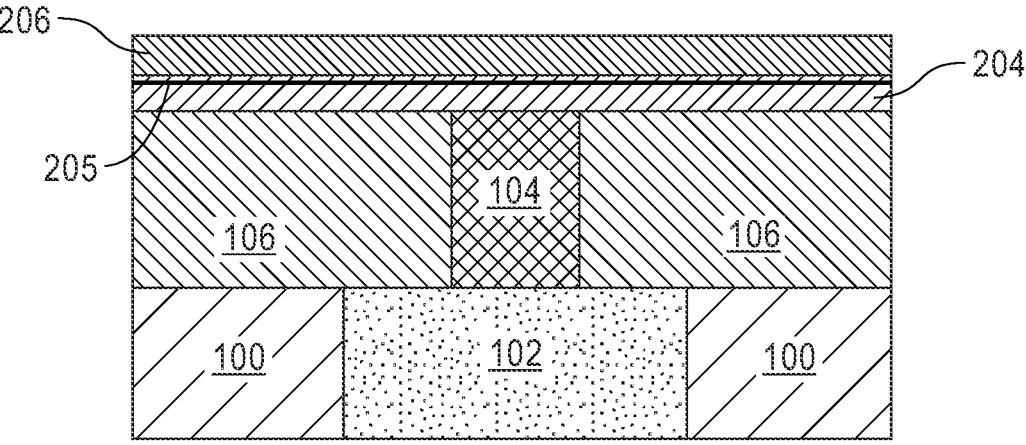
FIG. 2 is a cross-sectional view of the DMTJ device of FIG. 1 after additional fabrication operations, according to embodiments.

Referring now to FIG. 2, a first MTJ stack 204 is formed on the via dielectric 106 and via fill layer 104. In some embodiments, the MTJ stack layer 204 includes a seed layer formed on the via dielectric layer 106. The seed layer has a crystal lattice and grain structure that is suitable as a growth surface for the free layer of the first MTJ stack 204. The seed layer can be a metal seed layer composed of Ru, Ta, NiCr or a combination of these materials, for example.

In general, an MTJ stack 204 may include a magnetic free layer (not shown), a tunnel barrier layer 205 and a reference layer (not shown). In general, the magnetic free layers have a magnetic moment or magnetization that can be flipped. In certain embodiments, the tunnel barrier layer is a barrier, such as a thin insulating layer between two electrically conducting materials. Electrons pass through the tunnel barrier by the process of quantum tunneling. In certain embodiments, the tunnel barrier layer 205 is composed of MgO. In certain embodiments, each layer of the MTJ stack 204 may have a thickness less than an angstrom to a thickness of several angstroms or nanometers. Examples of typical materials in an MTJ stack 204 can include MgO for the tunnel barrier layer, CoFeB for the free layer, and a plurality of layers comprised of different materials for the reference layer. It should be appreciated that the MRAM material forming the MTJ stack 204 is not limited to these materials or the layers described above. That is, the MRAM material stack can be composed of any known stack of materials used in MRAM devices. Moreover, it should be appreciated that either of the first MTJ stack 204 and the second MTJ stack 704 (see, FIG. 8) may include additional layers, omit certain layers, and each of the layers may include any number of sublayers. Moreover, the composition of layers and/or sublayers may be different between the first MTJ stack 204 and the second MTJ stack 804 (see, FIG. 8).

As shown in FIG. 2, a non-magnetic spin conducting layer 206 is formed on the first MTJ stack 204. The spin conducting layer 206 is formed between the first MTJ stack 204 and the second MTJ stack 804 (see, FIG. 8), and in certain examples may be comprised of Cu, CuN, Ag, AgSn or combinations thereof. In general, a function of the spin conducting layer 206 is to collect the spin current from the tunnel barrier layer of the first MTJ stack 204.

Figure 3:
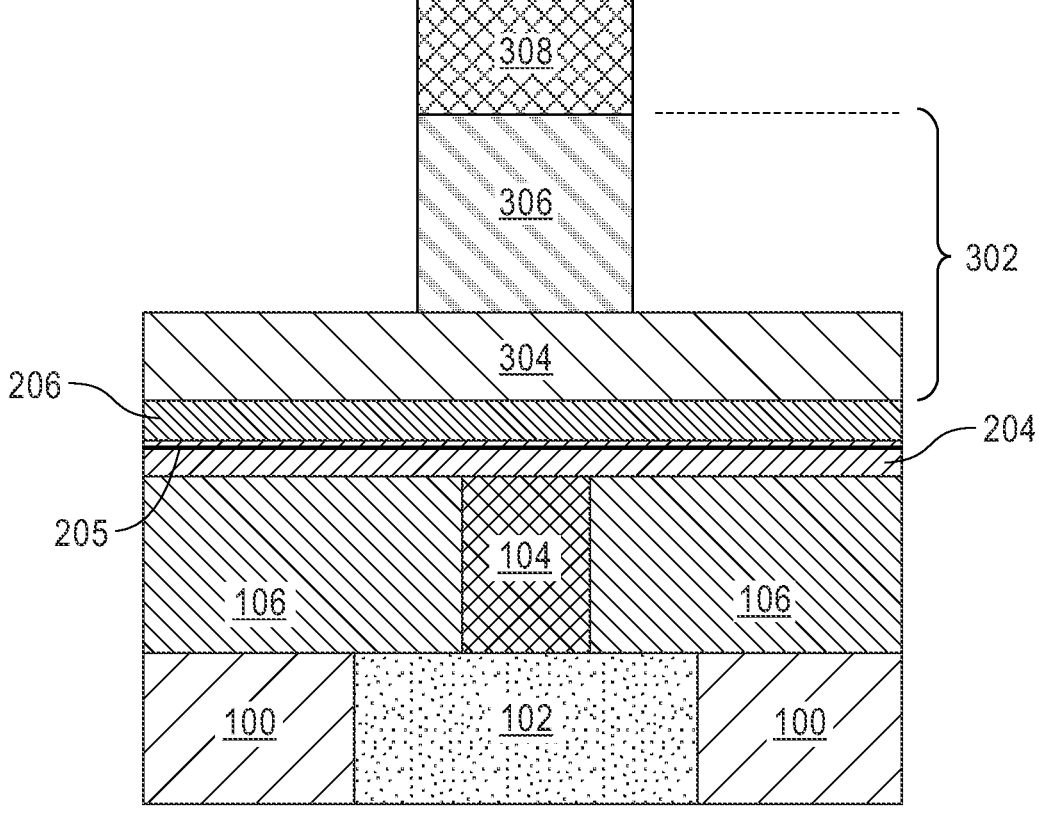
FIG. 3 is a cross-sectional view of the DMTJ device of FIG. 2 after additional fabrication operations, according to embodiments.

Referring now to FIG. 3, a sacrificial dielectric/organic hardmask stack 302 is deposited on the spin conducting layer 206. In some embodiments, the hardmask stack 302 is composed of a layer 304 of Ta or Ru and a layer 306 of TaN. The hardmask stack 302 is subsequently patterned by lithography and RIE. In certain embodiments, the layer 306 of hardmask stack 302 is patterned using a layer 308 composed of organic planarization layer ("OPL") material, an oxide such as SiN_x, SiO_x, SiARC, a photoresist, or a combination thereof, and an RIE stop on etch stop layer 304.

Figure 4:
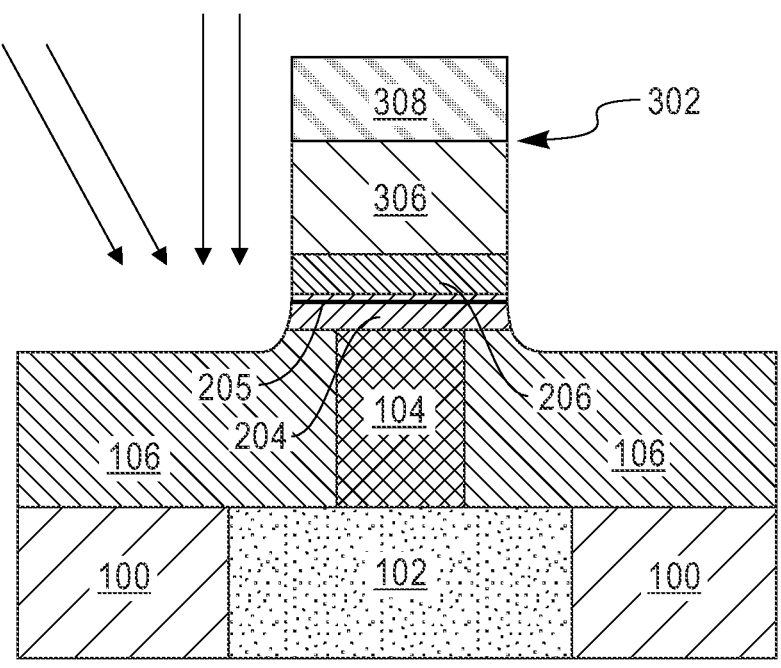
FIG. 4 is a cross-sectional view of the DMTJ device of FIG. 3 after additional fabrication operations, according to embodiments.

Referring now to FIG. 4, the first MTJ stack 204 is patterned with IBE or RIE while utilizing the sacrificial dielectric/organic hardmask stack 302 for the pattern. As shown in FIG. 4, the etching is stopped inside (or near the top of) the via dielectric layer 106. In some embodiments, the MTJ stack 204 is patterned by IBE at multiple angles or RIE or a combination thereof. Thus, after the etching procedure, the widths of the spin conducting layer 206, the first MTJ stack 204 have been reduced. In certain embodiments, at this stage of the manufacturing process, an air-break can be utilized (i.e., after the formation of the spin conducting layer 206). In certain embodiments, controlled in-situ oxidation can be utilized to remove partial electrical shorts due to metallic redeposition.

Figure 5:
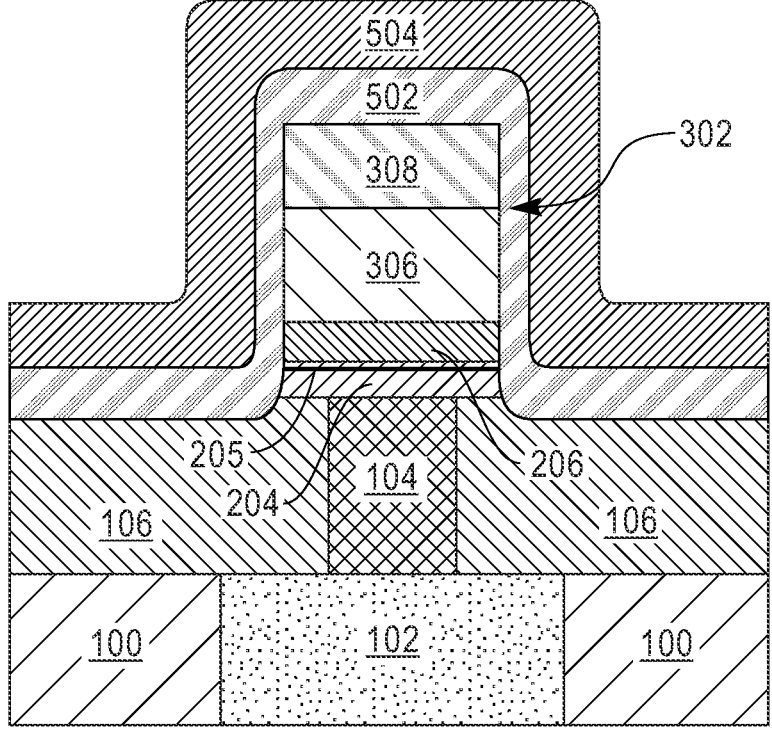
FIG. 5 is a cross-sectional view of the DMTJ device of FIG. 4 after additional fabrication operations, according to embodiments.

Referring now to FIG. 5, a first dielectric layer 502 is deposited. This first dielectric layer 502 may be composed of SiN, SiBCN, SiON, SiOx, SiCON, or AlOx, or a combination thereof, or any other suitable dielectric material. As shown in FIG. 5, the first dielectric layer 502 is deposited to a sufficient height to at least cover the sidewalls of the spin conducting layer 206 and the first MTJ stack 204. In certain embodiments, the first dielectric layer 502 is formed to cover the sidewalls and the top surface of the sacrificial dielectric/ organic hardmask stack 302 to encapsulate the MTJ stack 204. A metallic seed layer 504 is deposited to cover the sidewalls and the top surface of the first dielectric layer 502. In some embodiments, the metallic seed layer 504 is for Cu and may be TaN, Ta, TaN, Ti, TiN, or any combination thereof.

Figure 6A:
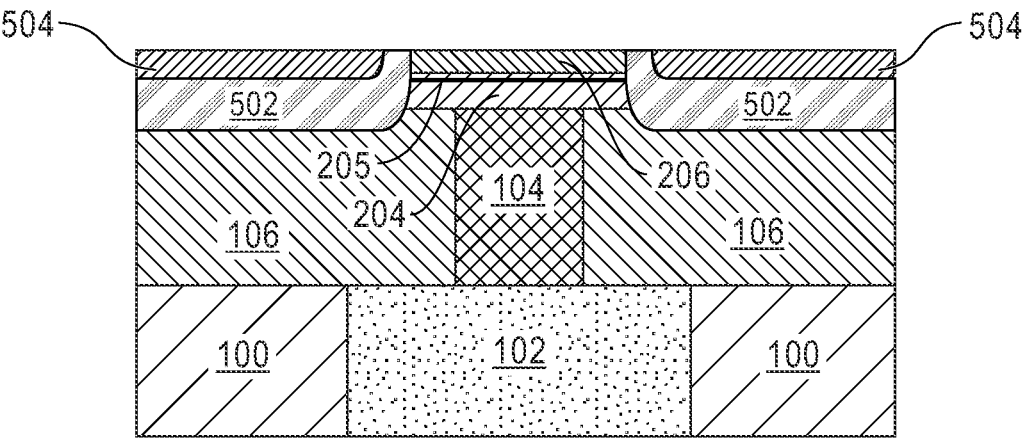
FIG. 6A is a cross-sectional view of the DMTJ device of FIG. 5 after additional fabrication operations, according to embodiments.
Figure 6B:
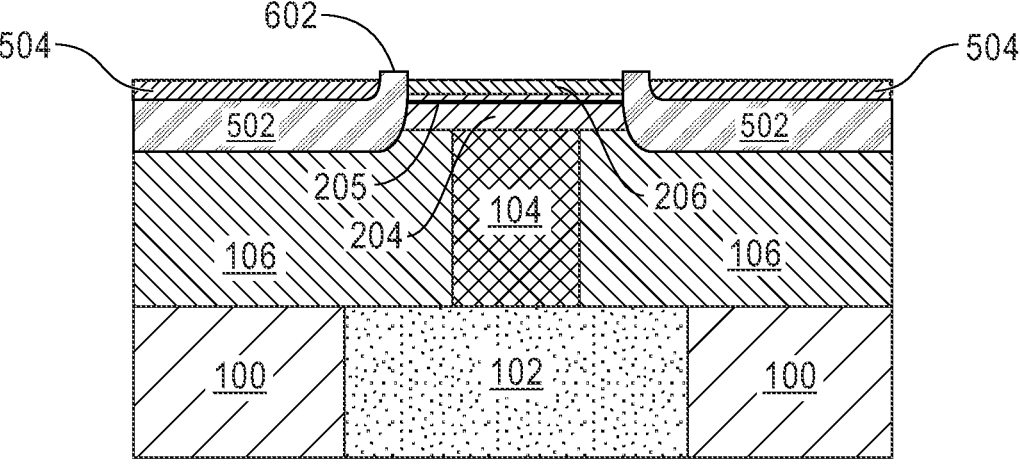
FIG. 6B is a cross-sectional view of the DMTJ device of FIG. 5 after additional fabrication operations, according to embodiments.

Referring now to FIG. 6A, CMP is performed on the device to remove part of the thickness of the recently deposited first dielectric layer 502 and the seed layer 504. The CMP is performed down to the point where the entire sacrificial dielectric/organic hardmask stack 302 is removed, and to generally coincide with the upper surface of the spin conducting layer 206. That is, enough material is removed to expose the upper surface of the spin conducting layer 206. In some embodiments, a multi-step CMP is performed to land inside the spin conducting layer 206 near its top. In some embodiments, as shown in FIG. 6B, step portion 602 is formed due to CMP rate difference between various layers.

Figure 7:
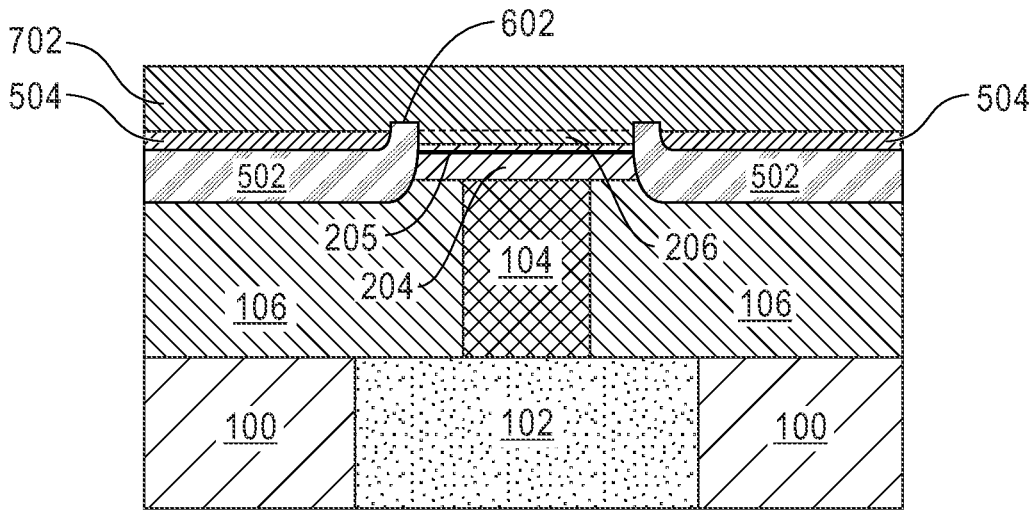
FIG. 7 is a cross-sectional view of the DMTJ device of FIG. 6B after additional fabrication operations, according to embodiments.

Referring now to FIG. 7, a second spin conducting layer 702 is deposited to initially cover the entire surface of the device followed by CMP. The material of second spin conducting layer 702 may be the same as, or different from, the material of the first the spin conducting layer 206. In certain embodiments, before the formation of the spin conducting layer 702, an anneal and a pre-sputter cleaning may be performed to remove any native oxide material after the CMP discussed above with regard to FIGS. 6A and 6B. Although FIGS. 7-11 show the step portion 602, it should be understood all of the steps described hereinafter may be performed on the structure as shown in FIG. 6A resulting in a final structure that does not have the step portion 602.

Figure 8:
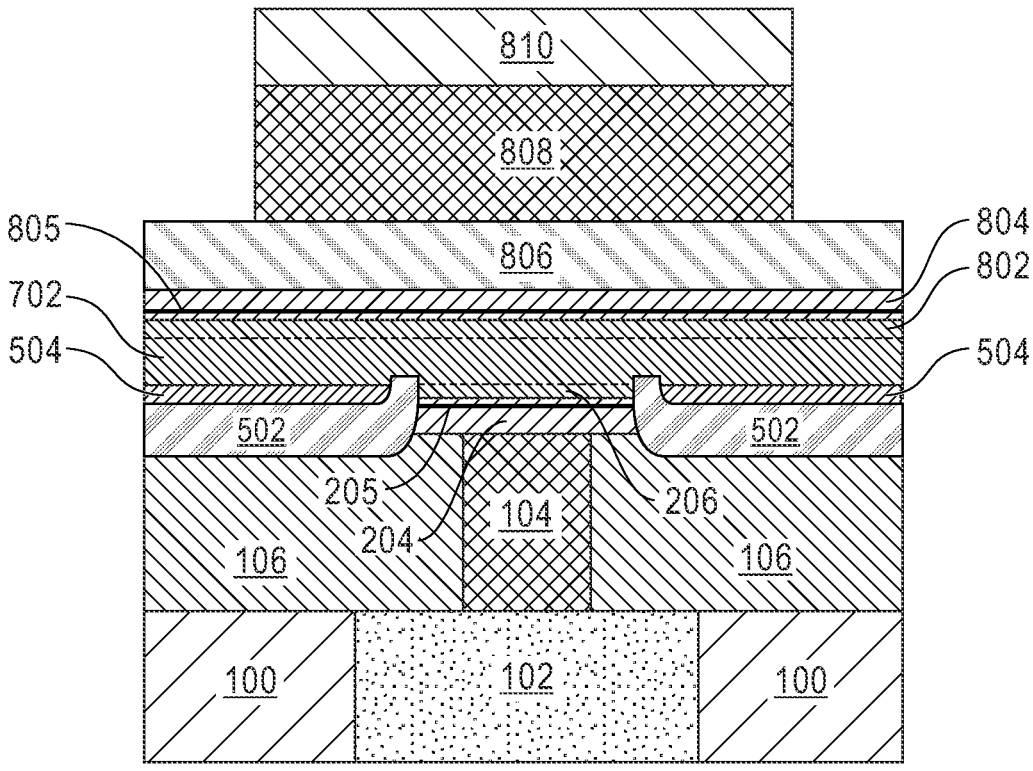
FIG. 8 is a cross-sectional view of the DMTJ device of FIG. 7, after additional fabrication operations, according to embodiments.

Referring now to FIG. 8, a third spin conducting layer 802 is deposited to initially cover the entire surface of the device followed by CMP. The material of the third spin conducting layer 802 may be the same as, or different from, the material of the first the spin conducting layer 206 and second spin conducting layer 702. In certain embodiments, before the formation of the spin conducting layer 802, a pre-sputter cleaning may be performed to remove any native oxide material after the CMP performed after the formation of the second spin conducting layer 702.

Referring further to FIG. 8, a second MTJ stack 804 is then formed on top of the third spin conducting layer 802. The number and type of layers of the second MTJ stack 804 may be the same as, or different from, the layers in the first MTJ stack 204. In some embodiments, the tunnel barrier layer of MTJ stack 804 includes at least tunnel barrier layer 805 composed of MgO. A metal etch stop layer 806 is then formed on the second MTJ stack 804. The metal etch stop layer 806 may be composed of Ru or any other suitable metal or alloy. A top electrode metal hardmask layer 808 is then formed on the metal etch stop layer 806. The top electrode metal hardmask layer 808 may be composed of W, TaN, TiN, a combination thereof, or any other suitable materials. A second sacrificial dielectric/organic hardmask stack 810 is then formed on the top electrode metal hardmask layer 808. The second sacrificial dielectric/organic hardmask stack 810 may be formed of the same or different materials as the first sacrificial dielectric/organic hardmask stack 302 discussed above with regard to FIG. 3 (e.g., OPL, $SiN_x$, $SiO_x$, photoresist, etc.). Finally, as shown in FIG. 8, the top electrode metal hardmask layer 808 and the second sacrificial dielectric/organic hardmask stack 810 are patterned by lithography and RIE, and the width of these layers is wider than the width of the previously formed first MTJ stack 204.

Figure 9:
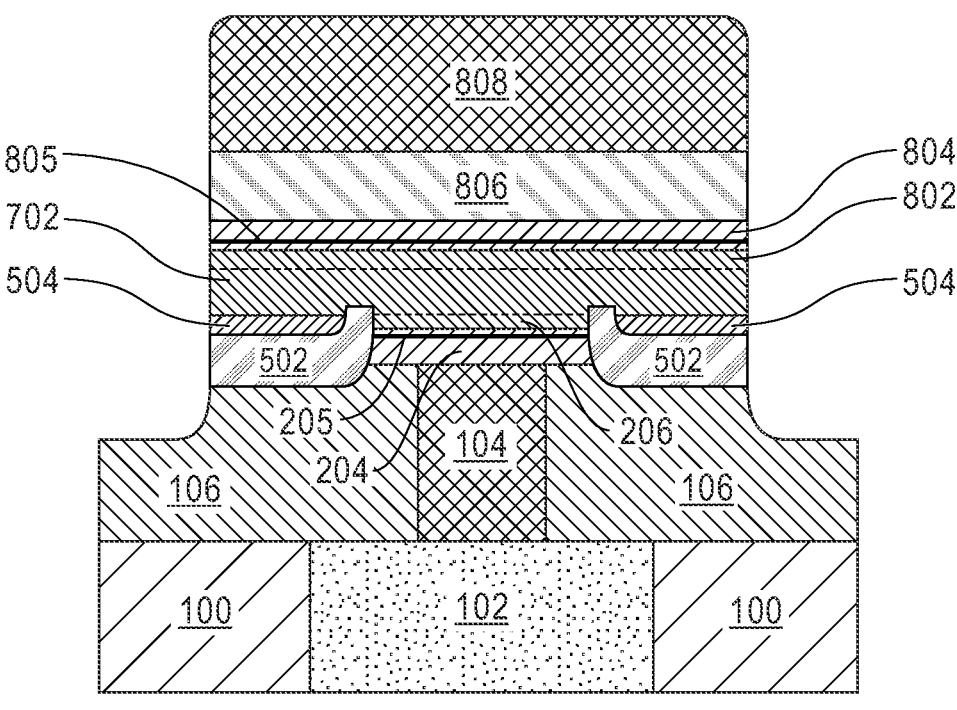
FIG. 9 is a cross-sectional view of the DMTJ device of FIG. 8, after additional fabrication operations according to embodiments.

Referring now to FIG. 9, the second MTJ stack 804 is patterned by IBE, RIE or a combination thereof utilizing the second sacrificial dielectric/organic hardmask stack 810 as a mask. Thus, the width of the second MTJ stack 804, and the first, second and third spin conducting layers 206, 702 and 802, have been reduced to be approximately the same as the width of the second sacrificial dielectric/organic hardmask stack 810. As shown in FIG. 9, the device is etched down to a level that is inside (e.g., near the top) of the via dielectric 106. Even after this removal step, the width of the second MTJ stack 804 is still greater than the width of the first MTJ stack 204. In certain embodiments, at this stage of the manufacturing process, an air-break can be utilized. In certain embodiments, controlled in-situ oxidation can be utilized to remove partial electrical shorts due to metallic redeposition near the MgO tunnel barrier layer 805 of the second MTJ stack 804.

Figure 10:
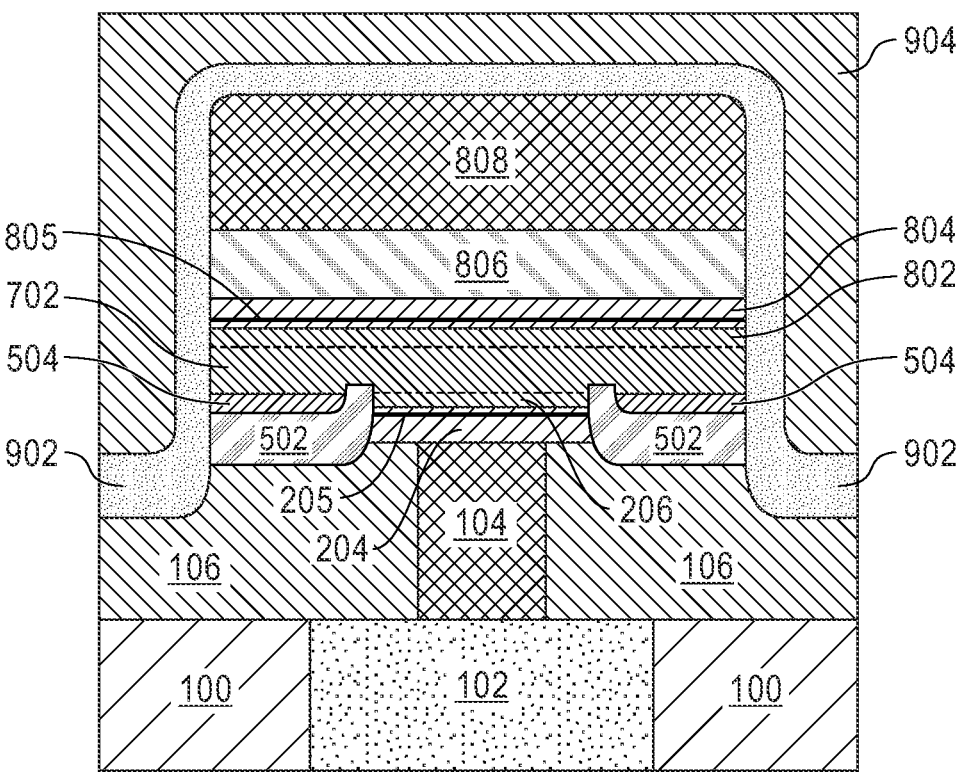
FIG. 10 is a cross-sectional view of the DMTJ device of FIG. 9, after additional fabrication operations according to embodiments.

Referring now to FIG. 10, a dielectric encapsulation layer 902 is formed to cover the exposed surfaces of the first, second and third spin conducting layers 206, 702 and 802, the second MTJ stack 804, the metal etch stop layer 806, and the top electrode metal hardmask layer 808. For example, the dielectric encapsulation layer may comprise at least one of PVD, ALD, PECVD, AlOx, $TiO_x$, BN, SiN and SiBCN. In certain embodiments, following the formation of the dielectric encapsulation layer 902, the device can be subjected to an optional pre-treatment utilizing, for example, plasma $O_2$, $H_2$, $N_2$, $NH_3$ or a combination thereof. Then, an interlayer dielectric layer (ILD) 904 is deposited and formed to fill in the spaces between adjacent DMTJ devices.

Figure 11:
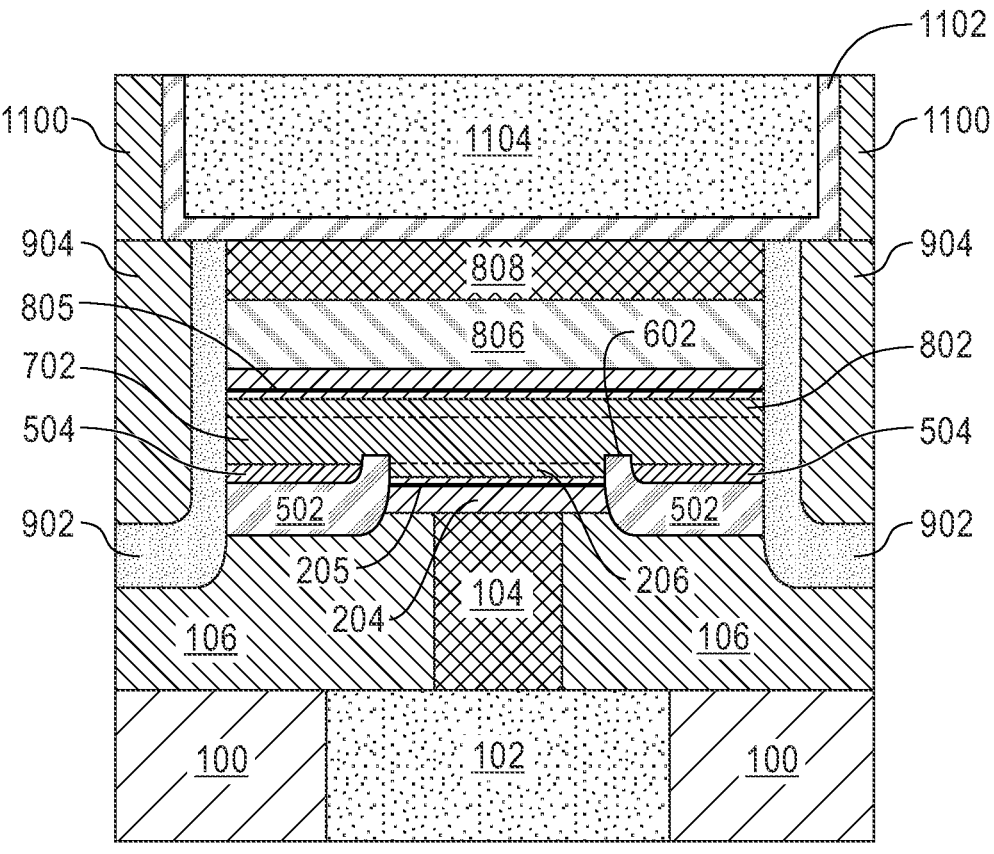
FIG. 11 is a cross-sectional view of the DMTJ device of FIG. 10, after additional fabrication operations according to embodiments.

Referring now to FIG. 11, a CMP planarization process is performed on the device to exposed upper surfaces of the top electrode hardmask layer 808 and the dielectric encapsulation layer 902. Then, following the CMP planarization process, a second ILD layer 1100 is formed by lithography. Then, the second ILD layer 1100 is subjected to a removal process (e.g., RIE) to remove portions of the second ILD layer 1100 to once again expose portions of the top electrode hardmask layer 808 and the dielectric encapsulation layer 902. Then, following the RIE process, a fill liner 1102 is formed, followed by the formation of a bit-line 1104. In certain embodiments, the bit-line 1104 is composed of Ta, TaN, Cu, or any suitable combination thereof.

In the present embodiments, an inverted modified double MTJ MRAM is provided that includes a top junction, the second MTJ 804 larger than the bottom magneto-tunneling junction, first MTJ 204. In the present embodiments, the two MTL layers 206 and 804 are connected using multiple spin-conducting layers 206, 702 and 802, such as Cu. In the present embodiments, metallic layer 504 forms a metallic ring, such as Ta or TaN, surrounded by two encapsulation dielectric layers 502 and 902 and located under the spin-conducting layers 206, 702 and 802. In some embodiments, a step portion 602 is formed between the spin conducting layer 206 and the metallic ring 504. In some embodiments, the inverted modified double MTJ MRAM structure includes a double-layer spin-conducting layers (206 and 702) or tri-layer spin-conducting layers (206, 702 and 802). The metallic ring 504 provides better adhesion of the second spin conducting layer 702 to the underlying dielectric layer 502.

In the present embodiments, the DMTJ junction device can achieve reduced switching current and increased TMR and speed relative to prior art single and double MTJ devices. In the present embodiments, the DMTJ junction device can achieve an increase in the switching efficiency (which is proportional to the retention and inversely proportional to the switching current) relative to prior art single and double MTJ devices. Moreover, the present embodiments may achieve an increased magnetoresistance ratio which potentially reducing the switching current. The present embodiments are BEOL compatible and CMOS compatible. Some embodiments are a plugin for any FEOL technology. Some embodiments are applicable to last-level-cache. Some embodiments are applicable to the hybrid cloud.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A double magnetic tunnel junction device, comprising:
   a first magnetic tunnel junction stack;
   a first spin conducting layer on the first magnetic tunnel junction stack;
   a metallic ring layer adjacent to the first spin conducting layer;
   a second magnetic tunnel junction stack on the first spin conducting layer, the second magnetic tunnel junction stack having a width that is greater than a width of the first magnetic tunnel junction stack; and
   first and second dielectric encapsulation layers surrounding the metallic ring layer.

2. The double magnetic tunnel junction device according to claim 1, wherein the first dielectric encapsulation layer includes a step portion having a height above the metallic ring layer.

3. The double magnetic tunnel junction device according to claim 1, wherein the first spin conducting layer has a width that is the same as the width of the first magnetic tunnel junction stack.

4. The double magnetic tunnel junction device according to claim 1, further comprising a second spin conducting layer on the first spin conducting layer and the metallic ring layer, the second spin conducting layer having a width that is greater than a width of the first spin conducting layer and greater than the width of the first magnetic tunnel junction stack.

5. The double magnetic tunnel junction device according to claim 4, further comprising a third spin conducting layer on the second spin conducting layer, the third spin conducting layer having a width same as the second spin conducting layer, the width of the third spin conducting layer being greater than the width of the first spin conducting layer and greater than the width of the first magnetic tunnel junction stack.

6. The double magnetic tunnel junction device according to claim 5, wherein the second magnetic tunnel junction stack is formed on the third spin conducting layer and wherein the third spin conducting layer and the second spin conducting layer have a width that is the same as the width of the second magnetic tunnel junction stack.

7. The double magnetic tunnel junction device according to claim 6, further comprising a first interlayer dielectric layer on the second dielectric encapsulation layer, a bit-line layer above the second magnetic tunnel junction stack and a second interlayer dielectric layer on sides of the bit-line layer.

8. The double magnetic tunnel junction device according to claim 1, wherein the metallic ring layer has a topmost surface that is coplanar with a topmost surface of the first spin conducting layer.

* * * * *